United States Patent [19]

Keeney et al.

[11] Patent Number: 5,553,020
[45] Date of Patent: Sep. 3, 1996

[54] STRUCTURE AND METHOD FOR LOW CURRENT PROGRAMMING OF FLASH EEPROMS

[75] Inventors: Stephen N. Keeney, Sunnyvale; Gregory E. Atwood, San Jose, both of Calif.

[73] Assignee: Intel Corporation, Santa Clara, Calif.

[21] Appl. No.: 521,656

[22] Filed: Aug. 31, 1995

Related U.S. Application Data

[63] Continuation of Ser. No. 267,815, Jun. 28, 1994, Pat. No. 5,487,033.
[51] Int. Cl.$^6$ .................................................. G11C 7/00
[52] U.S. Cl. .................. 365/185.19; 365/185.24; 395/430
[58] Field of Search ................. 365/185.19, 185.24, 365/185.28, 185.29, 185.30; 395/430, 164

[56] References Cited

U.S. PATENT DOCUMENTS

| | | | |
|---|---|---|---|
| 5,042,009 | 8/1991 | Kazerounian et al. | 365/185 |
| 5,132,935 | 7/1992 | Ashmore, Jr. | 365/185.19 |
| 5,218,571 | 6/1993 | Norris | 365/185 |
| 5,258,949 | 11/1993 | Chang et al. | 365/189.01 |
| 5,289,401 | 2/1994 | Shima | 365/185 |
| 5,339,270 | 8/1994 | Jiang | 365/185 |
| 5,341,342 | 8/1994 | Brahmbhatt | 365/185 |
| 5,349,220 | 9/1994 | Hong | 365/185 |
| 5,361,235 | 11/1994 | Kodama | 365/185 |

*Primary Examiner*—David C. Nelms
*Assistant Examiner*—Vu A. Le
*Attorney, Agent, or Firm*—Blakely, Sokoloff, Taylor & Zafman

[57] ABSTRACT

A system and method for programming non-volatile memory enables fast low current programming. Low current programming is achieved by applying a source bias voltage and increasing the drain voltage to be greater than the source bias voltage to maintain fast programming. Furthermore, the control gate voltage may be stepped or ramped from a minimum value to a maximum value to further reduce the peak channel current and to allow the flash cell threshold voltage to be placed to an exact value, for MLC applications. Ramping or stepping of the control gate may be done independently or in conjunction with an applied source bias voltage. Furthermore, the reduced cell current allows more cells to be programmed in parallel which improves program performance and the drain select device can be reduced in size to reduce die area.

8 Claims, 11 Drawing Sheets

STRUCTURE AND METHOD FOR LOW CURRENT PROGRAMMING OF FLASH EEPROMS

This is a continuation of application Ser. No. 08/267,815, filed Jun. 28, 1994 now U.S. Pat. No. 5,481,033.

BACKGROUND OF THE INVENTION

1. Field of the Invention

The present invention relates to the field of computer memory. More particularly, the present invention relates to a method and structure for placing charge onto the floating gate of a non-volatile memory element while drawing low levels of current.

2. Art Background

Flash memory refers to one type of erasable and electrically programmable read-only memory (EEPROM) which uses MOS transistors that include electrically isolated gates referred to as floating gates. An illustrative diagram is shown in FIG. 1. The memory cell 10 includes a drain region 15 and a source region 20 in a substrate 23. The source region 20 and drain region 15 are asymmetrically doped. A polysilicon floating gate 25 is generally disposed above and between these regions and insulated from these regions by an insulating layer. The floating gate 25, at completion of processing, is completely surrounded by insulating layers and hence electrically floats. A second gate referred to as the control gate 30 is disposed above the floating gate and is fabricated from a second layer of polysilicon. The second insulating layer separates the floating gate 25 from the control gate 30.

Typically the flash memory cells are programmed by hot electron injection. As electrons are attracted and captured onto the floating gate, the threshold voltage of that memory cell is altered. The threshold voltage is defined to be the minimum amount of voltage that must be applied to the control gate before the memory cell is "turned on" to permit conduction between the cell's source and drain regions. The threshold voltage characteristics of a memory cell are controlled by the amount of charge that is retained on the floating gate of the memory cell.

Referring to FIG. 2, the memory cells are programmed (by negatively charging the floating gate) by connecting the control gate programming potential of approximately 12 volts, the drain region to a drain programming potential of approximately 6 volts and the source region to ground. Under these conditions, electrons are collected on the floating gate causing the threshold voltage of the memory cell to rise. When this occurs, the memory cell is said to have a programmed threshold voltage $V_{tp}$.

To erase the cell, the drain region is floated, the control gate is grounded and an erasure potential of approximately 12 volts is applied to the source region. Alternatively, the source voltage may be lowered to approximately 5 V and a negative voltage of approximately −8 V is applied to the control gate. Under these conditions, electrons tunnel from the floating gate to the source region. This removes the electrons deposited on the floating gate of the memory cell, causing the threshold voltage of the memory cell to decrease. The memory cell is then said to have an erase threshold voltage $V_{te}$.

To read the memory cell, a positive read potential less than that which would cause electron transfer onto the floating gate, for example, 5 volts, is supplied to the control gate. A potential, for example, 1 volt, is also supplied to the drain region and the source is grounded. The amount of current flowing through the device is sensed to determine if the floating gate is charged with electrons, indicating that the memory cell has been programmed.

One disadvantage of prior flash EPROMs is that the drain current utilized during the program operation is quite high, for example, 800 microamps. The relatively high quantity of current renders it difficult to provide programming voltage from charge pumps located on the component. Furthermore, the amount of current limits the number of flash cells that can be programmed in parallel as only a limited amount of current is available at any one time. Simply lowering the current utilized may be performed; however, the lower current drastically increases the amount of time needed to program memory cells. Furthermore, the size of the drain select device is determined by the maximum current required by the cell during programming, thus lowering the programming current reduces the size of the drain select device.

Multilevel Flash EEPROM cells (MLC) are a promising approach to allow an increased amount of information to be stored. In a MLC component, each memory cell can store one of a plurality of concentrations of electrons on the floating gate, enabling each cell to store one of a plurality of threshold voltages and therefore provide additional information in each cell. However, a MLC must be precisely programmed to properly delimit the different quantities of electrons the floating gate can store. This is a slow process since the Vt of the flash cell is adjusted slowly in order to precisely generate the desired threshold voltage value. To offset the overall amount of time required to program an array of MLCs, it is desirable to program a number of cells in parallel. However, the amount of current required is multiplied by the number of cells to be programmed in parallel. Therefore, if the individual cell current can be reduced during placement of the threshold voltages on the MLC, then more cells can be programmed in parallel, thereby improving the programming performance.

SUMMARY OF THE INVENTION

It is therefore an object of the present invention to provide structure and method for reducing current required during programming, while maintaining a sufficiently high gate current to program in an acceptable amount of time.

It is further an object of the present invention to provide a structure and method for precisely controlling programming of flash EPROM cells, such as multilevel cells, such that a cell can be programmed to any specified threshold within a specified range of threshold values.

It is a further object of the present invention to program more cells in parallel to improve programming performance, particularly during the operation of a multilevel cell.

It is a further object of the present invention to reduce the size of the drain select device by reducing the maximum programming current.

In the present invention, a bias voltage is placed on the source junction to reduce the drain current during programming. This is preferably performed in combination with increasing the drain voltage applied to the cell to maintain fast programming by establishing a large drain-to-source voltage. Furthermore, by stepping or ramping the control gate voltage, a further reduction of the current utilized is achieved and further permits the controlled placement of the threshold voltage of each cell. The stepped or ramped gate may be used with or without source bias to reduce the peak programming current. The addition of source bias further reduces the programming current.

In the preferred embodiment, the source node of the cell to be programmed is biased to a small positive voltage and the drain voltage applied to the drain node of the cell is set to a value greater than the source voltage and sufficiently high to generate channel hot electrons which can be collected at the floating gate. The control gate voltage is initially set to a low value when the threshold voltage of the cell is low. The control gate voltage is then increased as the floating gate becomes charged with electrons and the threshold voltage increases.

The present invention is particularly useful in a multilevel cell architecture which requires precise control of the threshold voltage programmed into each cell. By decreasing the amount of current required to program each multilevel cell, more cells can be programmed in parallel, thereby increasing the overall programming speed of the memory array.

In an alternate embodiment, one or more flash cells are placed in a separate well in the substrate. The well is then biased to a negative potential during programming. The source may then be set to a zero or nominal value and the drain bias several volts above the source voltage in order to achieve the same low current programming.

BRIEF DESCRIPTION OF THE DRAWINGS

The objects, features and advantages of the present invention will be apparent from the following detailed description in which.

DETAILED DESCRIPTION OF THE INVENTION

In the following description for purposes of explanation, numerous details are set forth in order to provide a thorough understanding of the present invention. However, it will be apparent to one skilled in the art that these specific details are not required in order to practice the present invention. In other instances, well known electrical structures and circuits are shown in block diagram form in order not to obscure the present invention unnecessarily.

Figure 1:
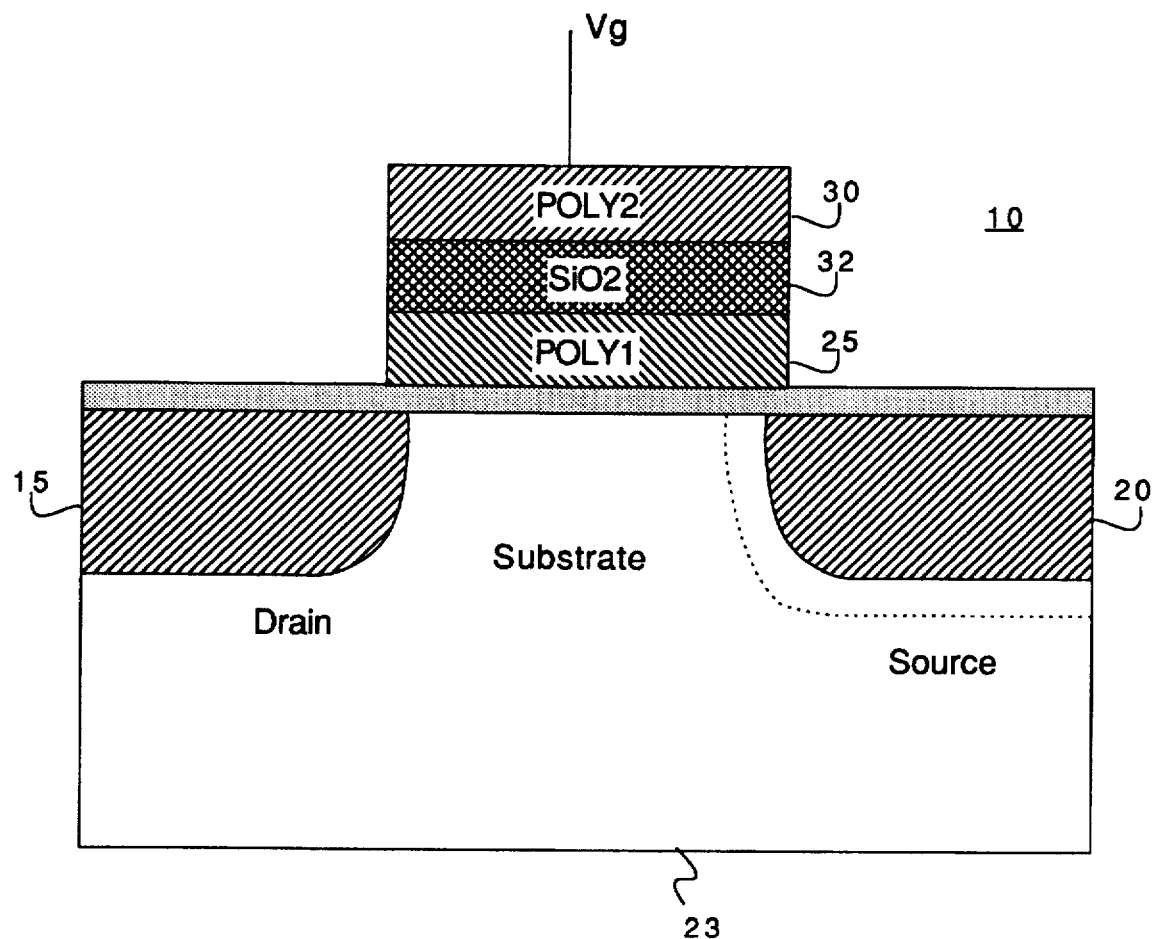
FIG. 1 illustrates a prior art flash EPROM cell.
Figure 2:
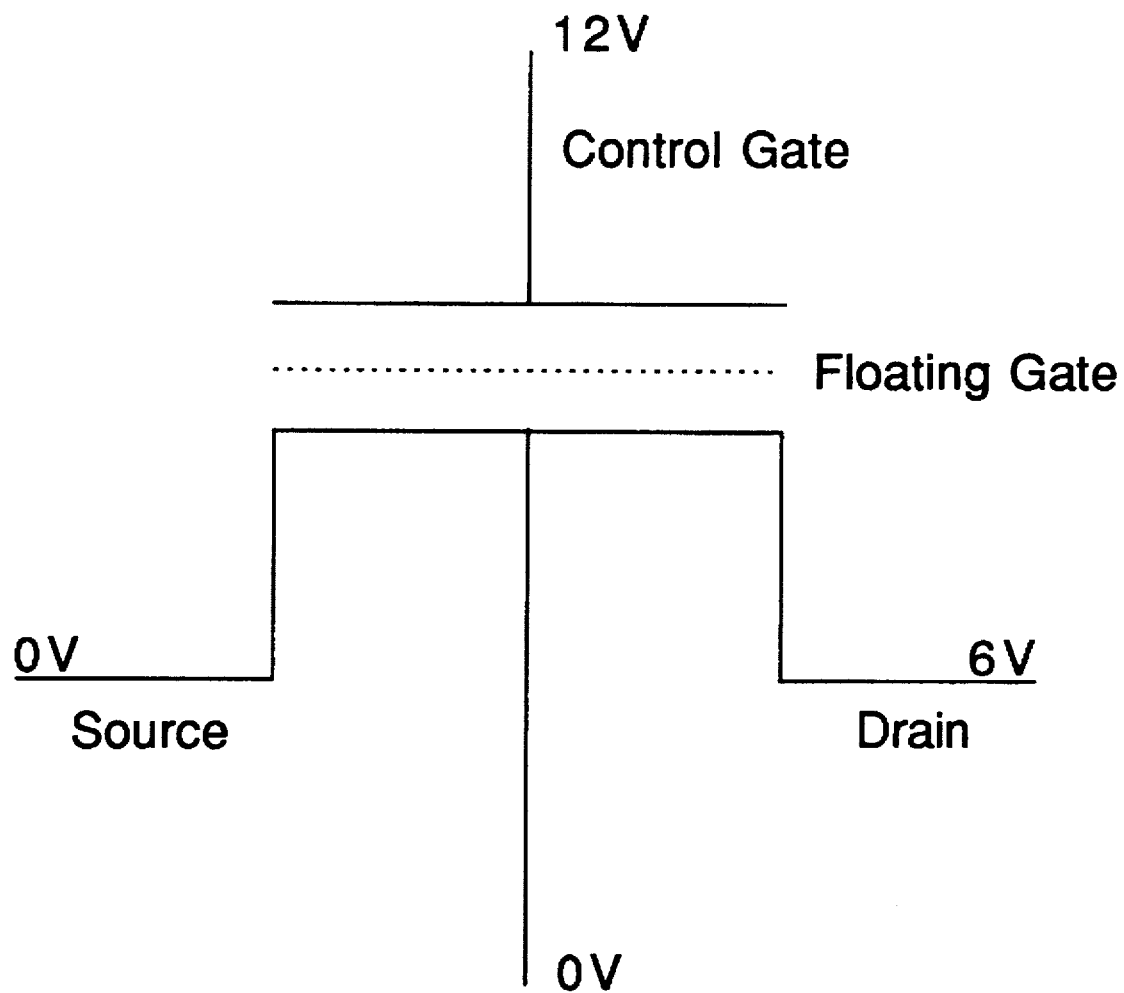
FIG. 2 illustrates the bias configuration for a prior art flash EPROM cell.
Figure 3A:
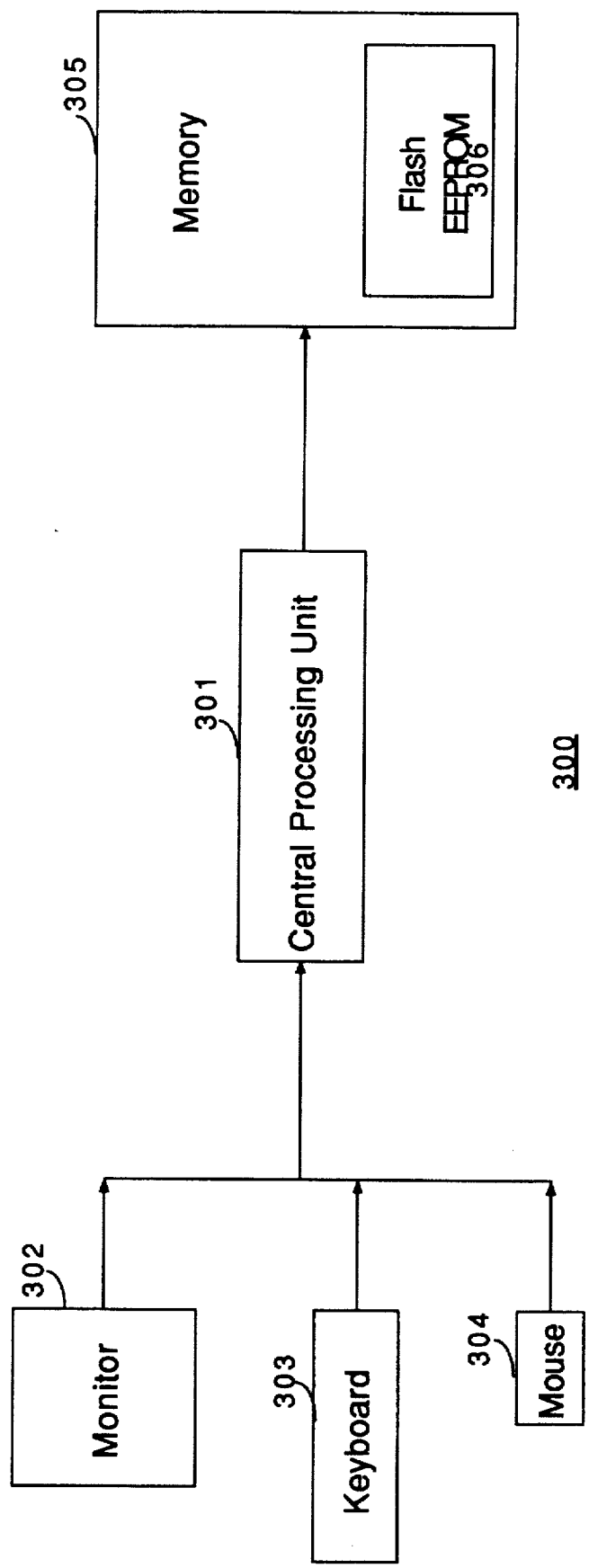
FIGS. 3a and 3b are block diagrams illustrating the embodiment of a system which includes a flash EPROM programmed in accordance with the teachings of the present invention.

FIG. 3a is a block diagram of an exemplary system employing the nonvolatile memory programmed in accordance with the teachings of the present invention. The computer system 300 includes a central processing unit ("CPU") 301 and a monitor 302 for visually displaying information to a computer user. A keyboard 303 allows the computer user to input data to the CPU, including data that may be subsequently stored in the memory 305. A cursor control device, such as a mouse 304 is used to control a cursor on the monitor 302. The memory 305 typically includes volatile and non-volatile memory elements. In the present embodiment, the memory includes flash EPROM 306 for non-volatile storage of data. The CPU 301 controls the programming, erasing and reading of data from the flash EPROM by the issuance of instructions and/or control signals to the flash EPROM. It will be realized that other types of systems, including personal digital assistants, digital audio systems, camera systems and the like, which utilize flash memory, may employ the teachings of the present invention.

Figure 3B:
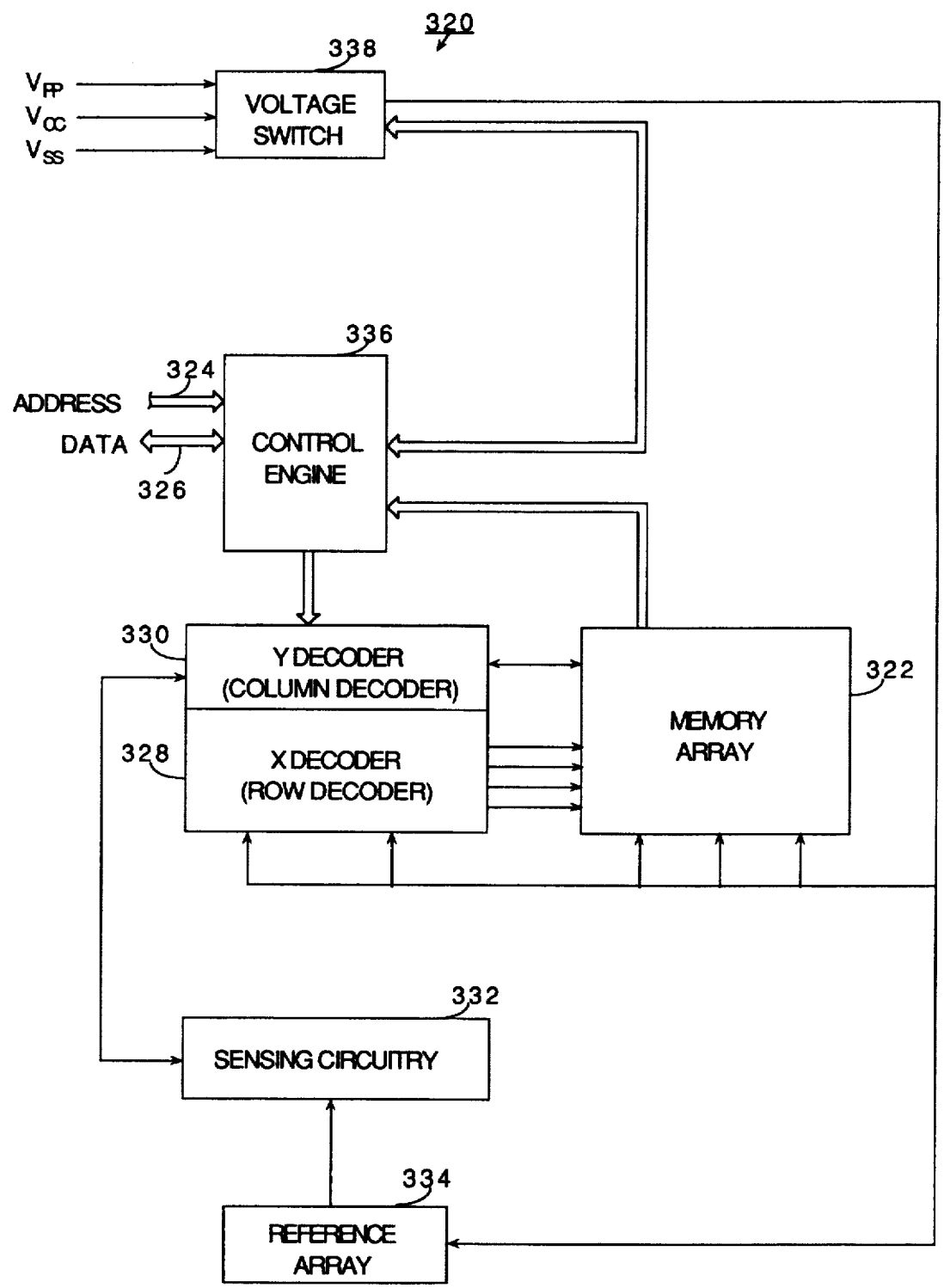

FIG. 3b is a block diagram of a memory device including programming circuitry which performs low current programming in accordance with the teachings of the present invention. The memory device 320 stores data using non-volatile memory cells within memory array 322. In the present embodiment, memory array 322 is comprised of flash memory cells. Each cell may store charge or, in the case of a multilevel cell (MLC), discrete amounts of charges.

In the absence of a high voltage level on the memory cells (VPP) memory device 320 acts as a read only memory. The data stored at an address indicated by address lines 324 is from memory array 322 and is output to the user via data lines 326.

The X decoder 328, also referred to as the row decoder, selects a row within the memory array 322 in response to address signals applied to address lines 324. Similarly, the Y or column decoder 330 selects a column in the memory array 320 in response to address signals from address lines 324. Data output from the memory array 322 is coupled to Y decoder 330 which passes the data onto sensing circuitry 332. Sensing circuitry 332 determines the state of data presented to it using reference cell array 334 and passes the results back to Y decoder 330. In the present embodiment, control engine 336 controls the erasure and programming of the memory array 322. Preferably the control engine 336 is implemented as a processor that is controlled by micro code stored in memory. However, it is readily apparent that the control engine 336 may be implemented in alternate ways, including a state machine or random logic.

The control engine 336 manages the memory array 322 via control of row decoder 328, column decoder 330, sensing circuitry 332, reference cell array 334 and voltage switch 338. The voltage switch 338 controls the various voltage levels necessary to read, program and erase the memory array 322. VCC is the device power supply, VSS represents ground and VPP is the program/erase voltage.

In the present embodiment, the user commands for erasing and programming the memory array 322 are communicated to the control engine 336 via signal lines. Preferably the commands are multiplexed across the address 324 or data 326 lines. However, separate command lines, such as output enable, write enable and chip enable may be used.

As is recognized, the programming circuitry is not intended to be limited to the control engine described above.

It is readily apparent that the low current programming method and system described herein can be utilized with other types of programming circuitry including well known prior art circuitry, such as hardwired logic, state machines and programmable logic arrays.

Using the structure and method of the present invention, flash EPROM components can be programmed utilizing low current while maintaining sufficiently high programming speed. For MLC devices, the present invention enables precise control of the amount of charge placed in the cell and thus the threshold voltage. Furthermore, as the amount of current required to program each cell is decreased, more cells can be programmed in parallel which improves programming performance. This is particularly beneficial for MLC devices as overall programming throughput can be increased by programming the cells in parallel. In addition, a smaller drain select device can be used, which reduces the die area. Typical prior art devices utilize a high current and therefore consume a significant amount of power in order to maintain a fast programming speed, or alternately use low current and expend a significant amount of time to perform the programming process. In the present invention, it has been determined that as the cell is programmed and the gate threshold voltage of the cell rises, the potential at the gate decreases and the channel current therefore decreases. Therefore initially, a lower gate voltage is applied to the cell to reduce the peak channel current. However, as electrons accumulate at the floating gate and the channel current decreases, the programming process slows down. To compensate, the control gate voltage can be increased as more and more electrons are placed at the gate of the cell.

In addition, to increase the gate current injection efficiency as a ratio of the drain current, a bias voltage is applied to the source junction to reduce the drain current. By providing the bias voltage on the source junction, electric fields are produced which allow electrons to become injected onto the floating gate more effectively. Furthermore, by applying the bias voltage to the source junction in combination with increasing the drain voltage, fast programming speed is achieved by maintaining a large drain to source voltage.

In an alternate embodiment, the control gate voltage is stepped or ramped from a minimum value to a maximum value to allow the controlled placement of the voltage threshold of the cell in addition to reducing the amount of current required. The controlled placement of the cell threshold voltage is of particular importance in a multilevel cell (MLC) structure. The memory cell can be programmed to exhibit multiple threshold levels ($V_t$). By storing multiple threshold levels, the memory cell can be programmed to store more than a single bit. In order to discern the multiple threshold levels, the memory system designates threshold windows. Each threshold window specifies a memory state of the cell. The multiple threshold levels demarcate $2^n$ number of windows for designating states to represent storage of "n" bits of data for the memory cells. For example, a memory cell capable of storing four states can represent two bits. The process of controlled placement of the cell threshold voltage is an extremely slow process as the threshold voltage must be carefully controlled to reflect the desired programmed state. By reducing the current, more cells can be concurrently programmed using the same total amount of current and the overall programming speed for the MLC array is increased. Thus, acceptable programming performance in MLC flash memories is achieved.

Figure 4:
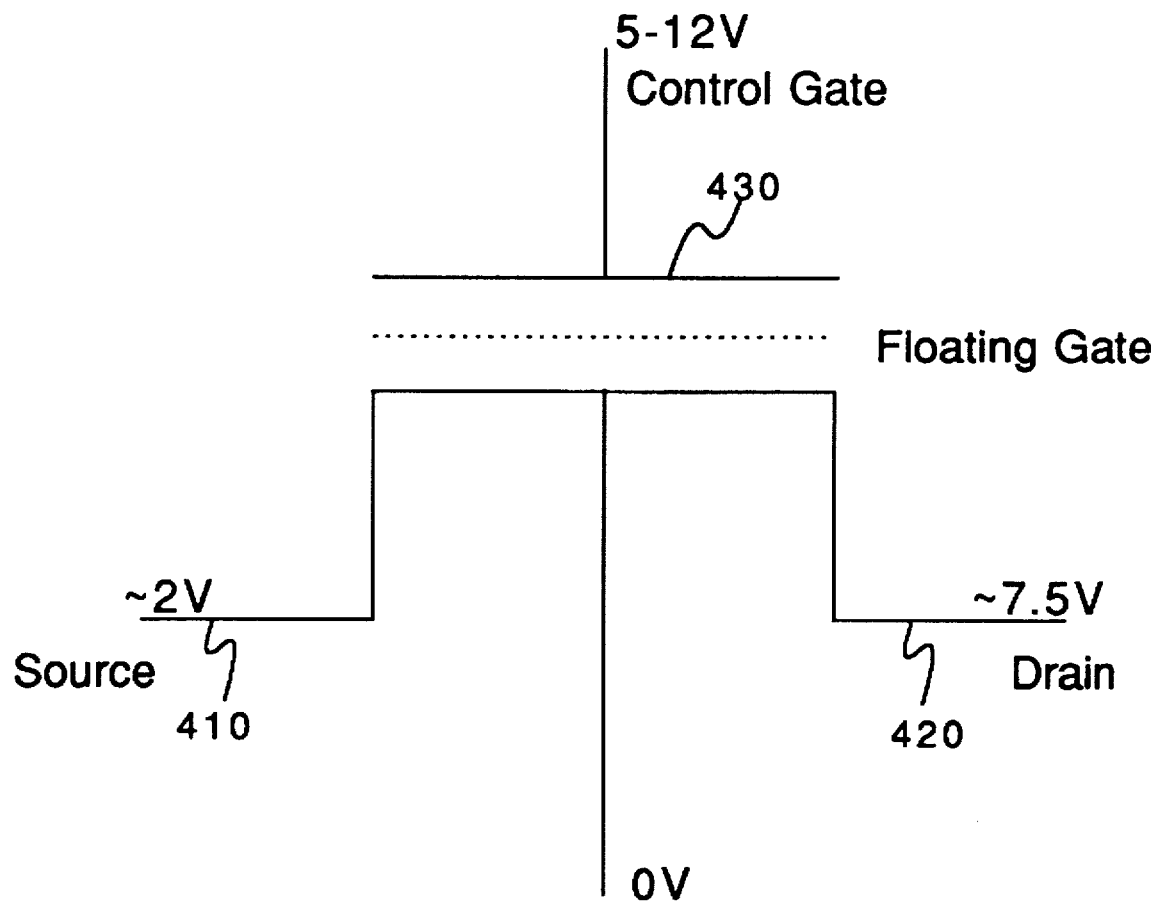
FIGS. 4 illustrates a bias configuration for one embodiment in accordance with the teachings of the present invention.

FIG. 4 shows the bias conditions for performing programming in accordance with the teachings of the present invention. The source junction 410 is biased to a small positive source voltage, for example a voltage in the range of 0.5 to 2.5 volts. The drain voltage applied to the drain 420 is greater than the source voltage and sufficiently high to generate channel hot electrons. For example, the drain voltage is preferably at least 3 volts, typically 6 volts, higher than the source voltage. In one embodiment, the control gate voltage applied to the control gate 430 is ramped from an initial low value to a final maximum value. The voltage applied is initially set to a low value, for example 4 volts, when the threshold voltage of the flash cell is low, and is increased as the floating gate becomes charged with electrons. Continuing with the present example, the control gate voltage would initially be set to a value of 4 volts and increased, either by stepping the voltage or applying a ramp voltage or other voltage function, to a maximum control gate voltage of 13 volts. Thus, by decreasing the amount of current required to program the cell, for the same total current utilized additional cells may be programmed in parallel. This is important to maintain acceptable programming performance in MLC flash memories. Alternatively, a ramped or stepped gate voltage may be used during programming with zero volts applied to the source to reduce the peak programming current. Although this technique is not as effective as when a source bias is applied, the ramping or stepping of the gate voltage does reduce the programming current and hence the drain select device size.

Figure 5:
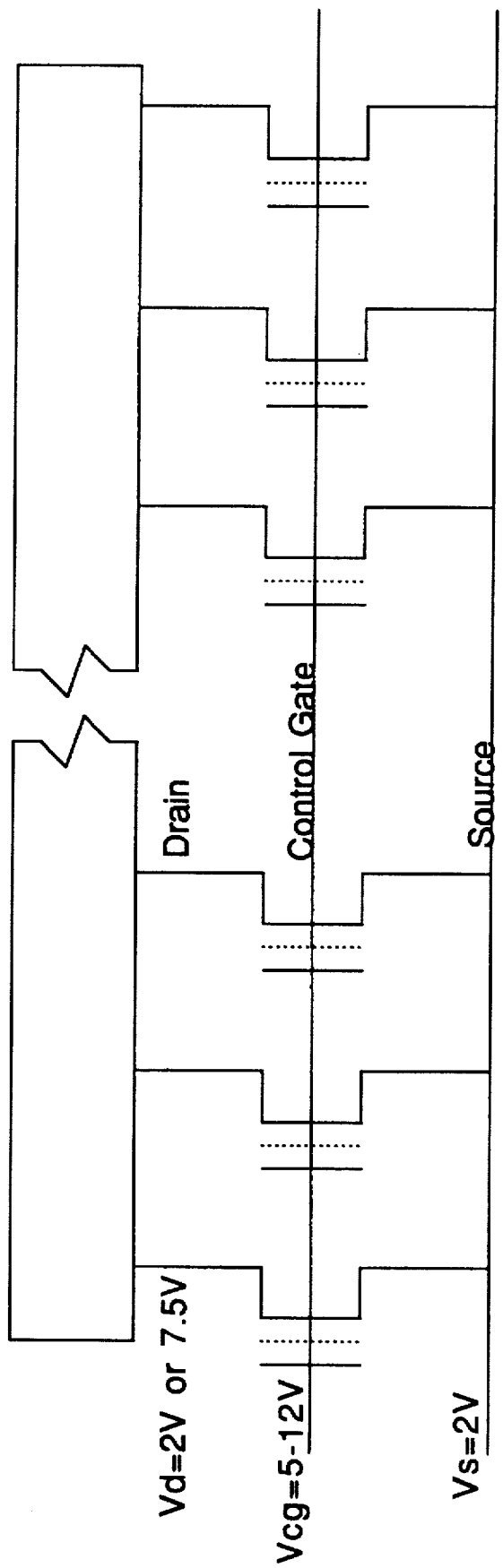
FIG. 5 illustrates the parallel programming of flash cells in accordance with the teachings of the present invention.
Figure 6:
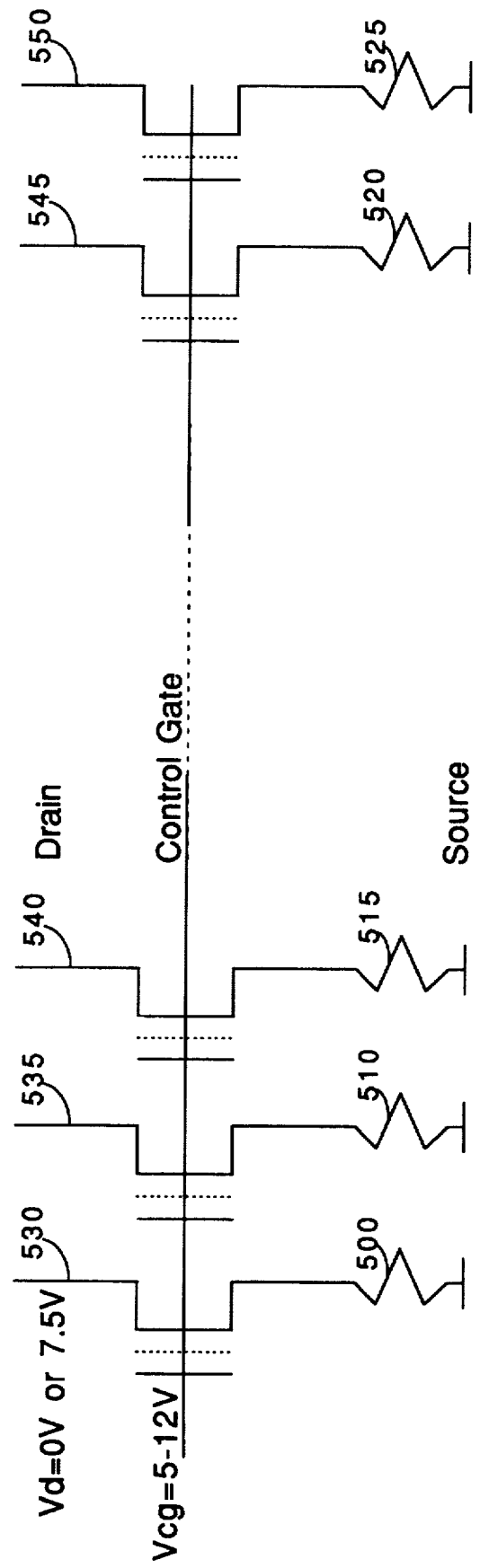
FIG. 6 illustrates the self-biasing of the source of flash cells in accordance with the teachings of one embodiment of the present invention.

FIG. 5 shows a multiplicity of cells, for example, multilevel cells, which can be programmed concurrently. The source bias voltage in one embodiment is generated by providing a resistance at the source junction to provide self-biasing at each source junction of each cell. This is illustrated in FIG. 6, wherein resistors 500, 510, 515, 520, 525, provide the self-biasing of the source of functions of transistors 530, 535, 540, 545, 550, respectively. The value of the resistance chosen is dependent upon the source bias voltage desired and the current applied to the source junction. For example, if the current provided is 100 microamps and it is desired to provide a 2 volt bias voltage, a source resistance of approximately 20KΩ would be connected to each cell.

Figure 7:
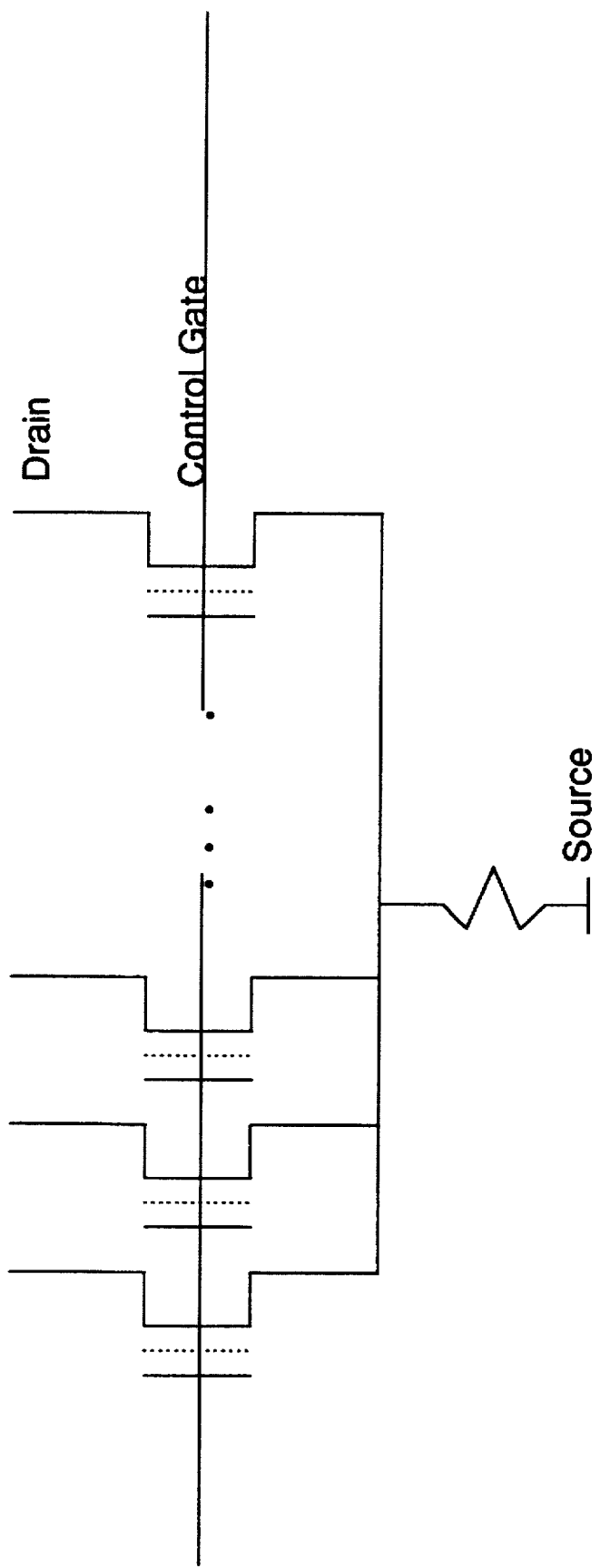
FIG. 7 illustrates an alternative embodiment for providing self-biasing of the source of flash cells.

In an alternate embodiment, as shown in FIG. 7, a single source resistance may be utilized for a plurality of cells. Although each cell requires its own resistance in order to generate the bias voltage, only a small subset of cells are programmed at any one time. Therefore a single resistor may be coupled to a plurality of transistors, as shown in FIG. 7, but as only one of those transistors is programmed at any one time, the single source resistance may be used.

Figure 8:
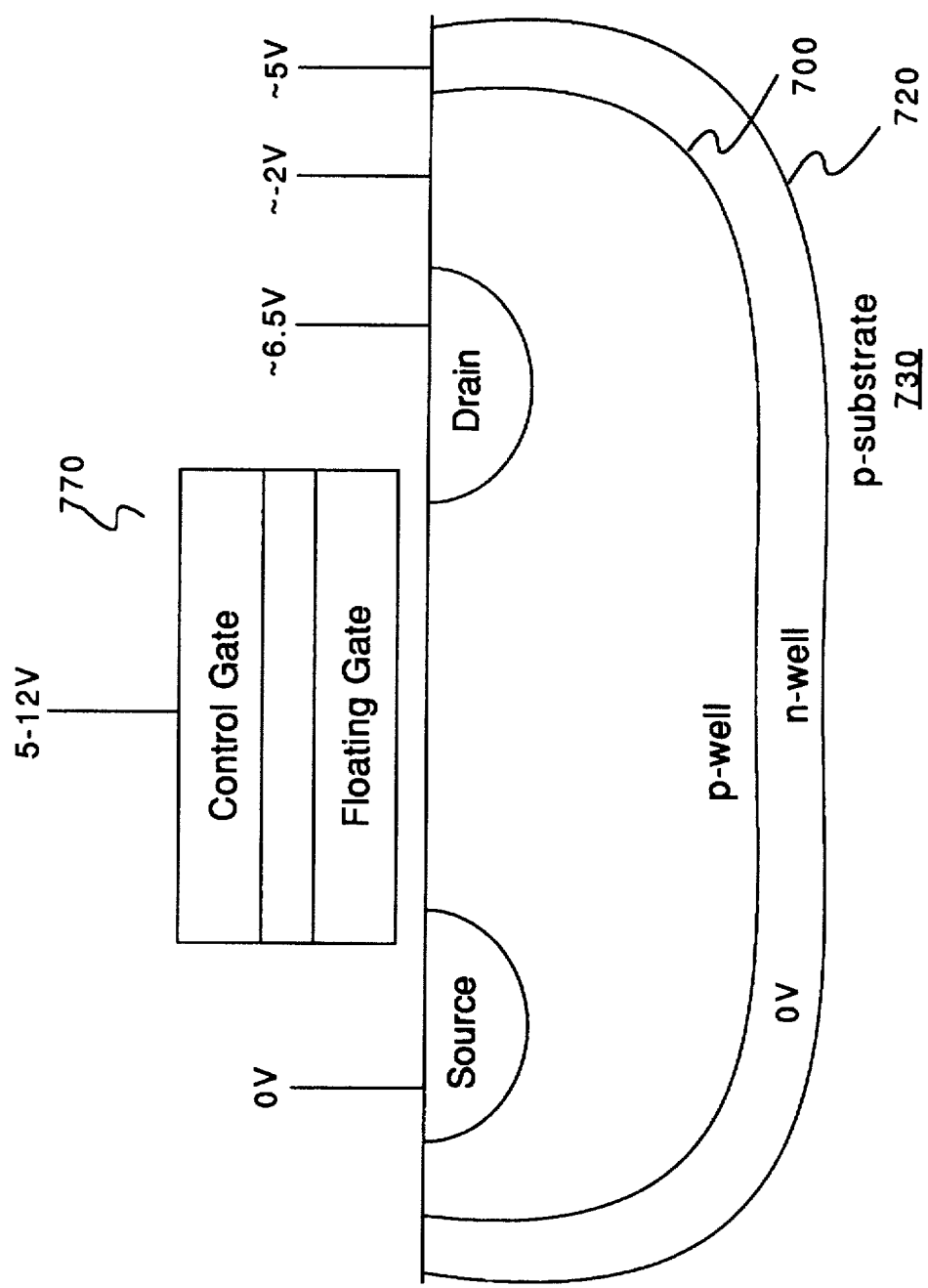
FIG. 8 illustrates an alternate embodiment in which a separate biased well is used to provide a negative reference potential.

In an alternate embodiment, a negative body bias is applied to the cells. This is preferably achieved in a triple well process wherein the cells are placed in a separate well. One or more cells may reside in the same well. During programming, the p-well is biased to a negative potential, for example, in a range of −0.5 to −2.5 volts. The source therefore does not need to be biased, that is, it is maintained at a zero or nominal voltage, and the drain is biased to a pre-determined number of volts above the source voltage, for example, 6 volts above the source potential. A positive voltage is applied to the n-well to isolate the p-well. This embodiment is illustrated in FIG. 8. The cell 710 is placed within p-well 700 which is in n-well 720, which resides in p-substrate 730. The p-well 700, during programming, is biased to −2 volts and the n-well 720 is biased to a positive voltage of approximately 5 volts. The source is biased at approximately 0 volts and the drain at approximately 6.5 volts. The same relative potentials are achieved without having to apply a separate voltage to the source. Of course, it is readily apparent that the above techniques may be used in combination to achieve the purpose of enhancing electron injection efficiency.

Figure 9:
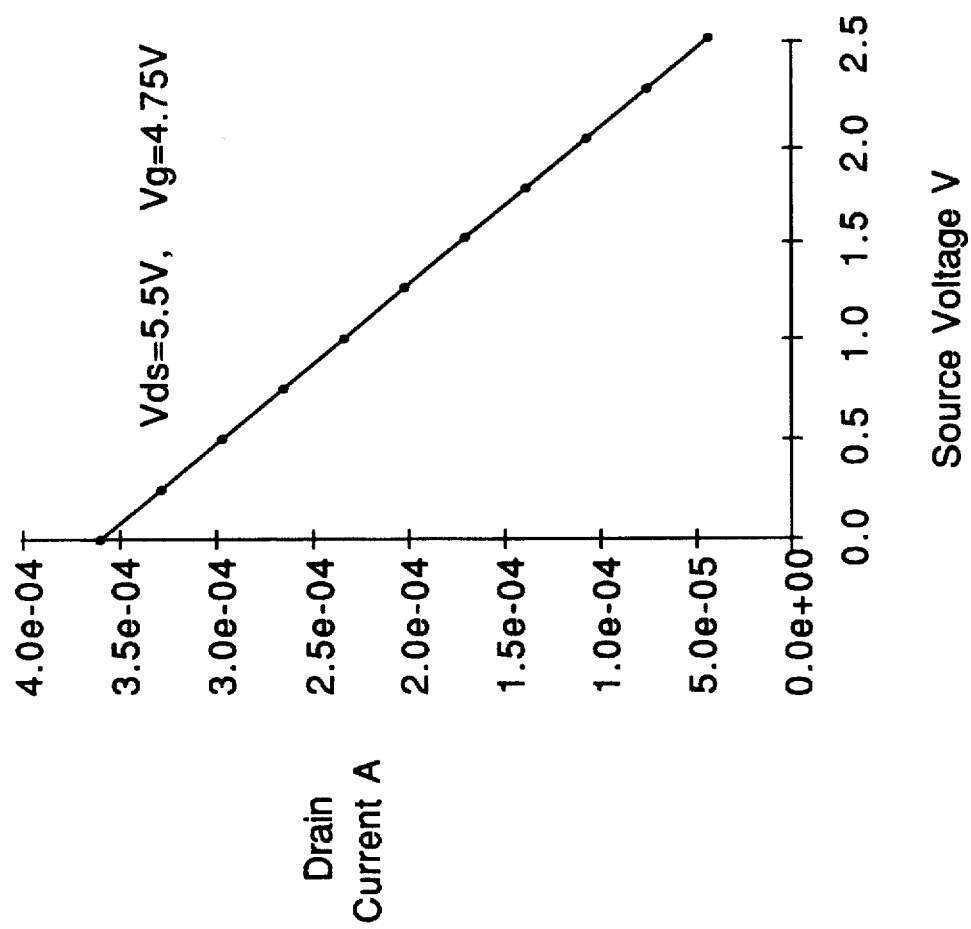
FIG. 9 is a chart which illustrates the drain decreasing current with increasing applied source voltage.

FIG. 9 illustrates the effect of the source bias on the drain current of the flash cell. In the illustration, the floating gate is held at a constant voltage, the source voltage is raised from 0 to 2.5 volts and the drain to source voltage is held to a constant value. The drain current is shown to reduce considerably as the source bias voltage is increased. Thus, the amount of current required to program the cell is decreased by applying a source bias voltage.

The present invention is particularly useful for programming multilevel flash EPROM cells (MLC). Multiple programming pulses are used to place discrete amounts of charge on the floating gates to permit the identification of different threshold values and therefore multiple bits of data in each cell. The structure described herein is particularly applicable to programming of multilevel cells. In one embodiment, the drain is pulsed one or more times until the desired threshold voltages are reached on the floating gate of each of the cells. In another embodiment, the voltage applied to the control gate is stepped in increments from an initial minimum value to a maximum value based upon the number of levels to program in the cell. For example, the increments may be 100 mV apart to provide the desired precision for controlling the value of the threshold voltage. The present invention therefore provides the accuracy required for multi level cell applications while minimizing the current utilized to perform the programming operation. This results in the ability to program more cells in parallel for the same current which decreases the overall programming time of the cell array.

Figure 10:
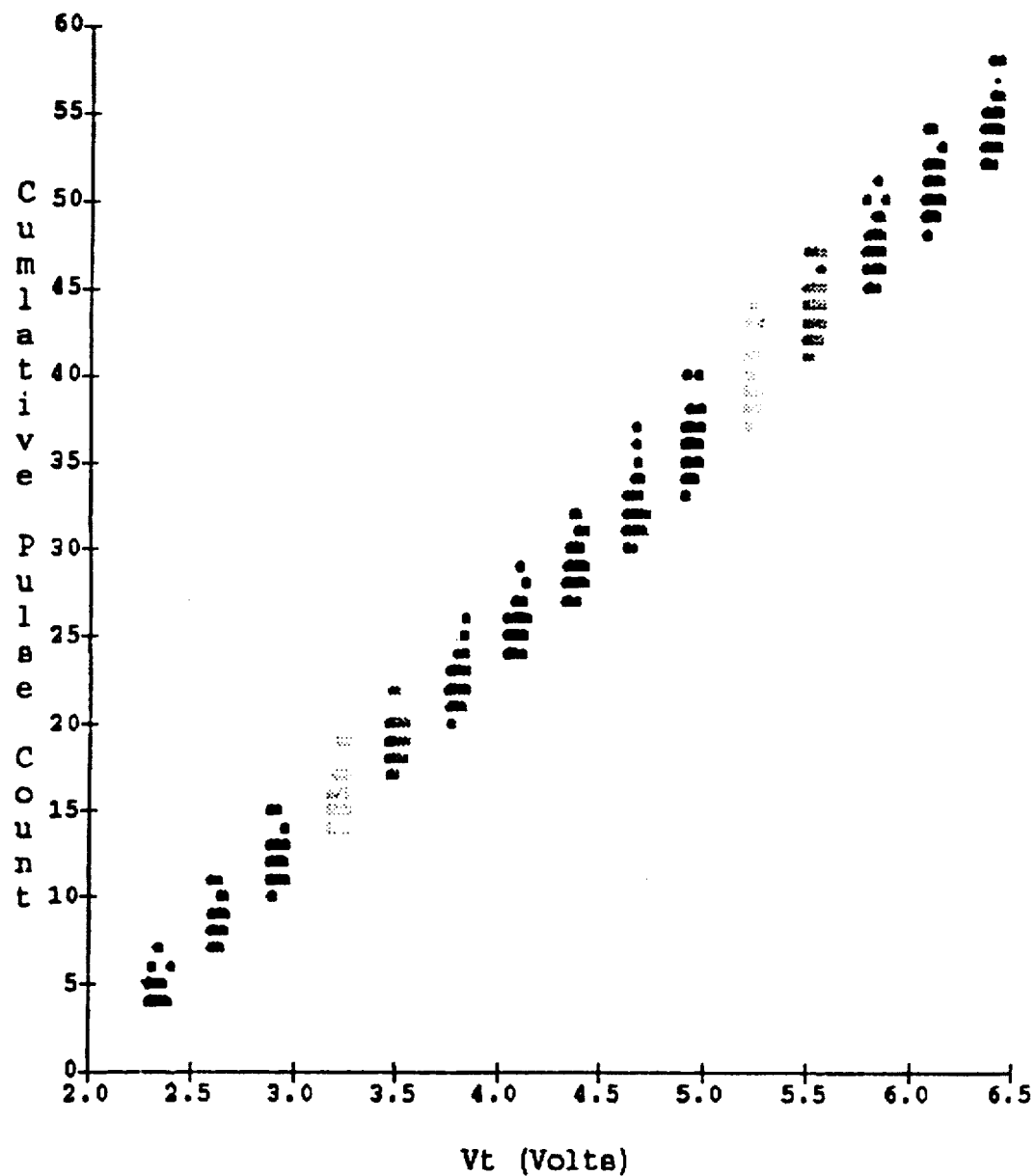
FIG. 10 is a graph illustrating the effectiveness of multilevel cell programming employing the process of the present invention.

FIG. 10 is a graph illustrating the effectiveness of the process for low current programming of multilevel cells in accordance with the teachings of the present invention. In this illustration, the source junction is biased at 1.75 volts and the drain is biased at 7.5 volts. The control gate voltage is initially set at 5.4 volts and is stepped in 80 mV steps. In this example, each flash cell receives one drain pulse for every step. The graph demonstrates the placing of 68 individual flash cells to different threshold voltages. The drain pulse duration in this example is one microsecond. It is readily apparent that the values employed here, e.g., voltages, number of pulses and pulse durations, are exemplary and can be varied to achieve different performance or accuracy targets. In general, the larger the step between pulses, the larger the peak drain current. Thus, the number of steps conceivably can be from a single to any number depending upon the precision required.

Referring to FIG. 10, the cells can be programmed within certain threshold regions by applying a certain number of pulses to the cell. For example, by applying between 4 and 7 pulses, all the cells are placed within the tight band shown to be located between approximately 2 and 2.5 volts. Furthermore, this graph demonstrates that the process of the present invention enables the gaps between threshold voltages to be carefully controlled to provide the discrete threshold voltages of a multilevel cell.

The invention has been described in conjunction with the preferred embodiment. It is evident that numerous alternatives, modifications, variations and uses will be apparent to those skilled in the art in light of the foregoing description. In particular, the low current programming is achieved by including a source bias voltage and, by ramping or stepping the gate voltage to compensate for the increase of electrons injected onto the floating gate and the decrease of the channel current. Furthermore, several different structures may be utilized, such as self-biasing and well biasing. In addition, this structure and method described herein is applicable to single-level and multilevel cell technology, and allows .

What is claimed is:

1. A system comprising:
   a processor; and
   a memory coupled to the processor, said memory comprising:
      a memory array comprising a plurality of cells, each cell comprising a floating gate, control gate, source junction and drain junction; and
      programming circuitry for programming a cell by applying an initial gate voltage to the control gate of the cell, and stepping the control gate voltage in predetermined increments to a maximum gate voltage, applying a source bias voltage to the source junction of the cell, and applying a drain voltage pulse to the drain junction of the cell to cause hot electron injection of electrons onto the floating gate, said drain voltage pulse applied at each stepped increment of the control gate voltage;
   said processor issuing control signals to the programming circuitry to program the cell.

2. The system as set forth in claim 1, wherein said programming circuitry further comprises at least one source bias resistor coupled to the source junction to provide the source bias voltage to the source junction.

3. The system as set forth in claim 1, wherein said programming circuitry further comprises a plurality of source bias resistors, one source bias resistor coupled to each source junction of each cell.

4. The system as set forth in claim 1, wherein said programming circuitry further comprises a plurality of source resistors, one source resistor coupled to a group of cells, wherein when a cell of a group is programmed, the source resistor provides the source bias voltage to the source junction.

5. The system as set forth in claim 1, wherein said programming circuitry programs a plurality of cells in parallel.

6. The system as set forth in claim 1, wherein said memory array further comprises at least one well, at least one cell located within the at least one well, said programming circuitry applying a negative well bias voltage to the well and applying approximately a zero source bias voltage to the source junction of the cell located within the well.

7. The system as set forth in claim 1, wherein the cell is a multilevel cell.

8. The system as set forth in claim 1, wherein the cell is a flash EEPROM cell.

\* \* \* \* \*

UNITED STATES PATENT AND TRADEMARK OFFICE
CERTIFICATE OF CORRECTION

PATENT NO.    : 5,553,020
DATED         : September 3, 1996
INVENTOR(S)   : Keeney et al.

It is certified that error appears in the above-identified patent and that said Letters Patent is hereby corrected as shown below:

In column 8 at line 13 insert --more cells to be programmed in parallel to increase programming efficiency-- following "allows" and prior to "."

Signed and Sealed this

Tenth Day of December, 1996

BRUCE LEHMAN

*Attest:*

*Attesting Officer*    Commissioner of Patents and Trademarks